(12) United States Patent
Chung et al.

(10) Patent No.: US 10,388,804 B2
(45) Date of Patent: Aug. 20, 2019

(54) SOLAR CELL AND METHOD OF MANUFACTURING THE SAME

(71) Applicant: LG ELECTRONICS INC., Seoul (KR)

(72) Inventors: Indo Chung, Seoul (KR); Juhong Yang, Seoul (KR); Eunjoo Lee, Seoul (KR); Mihee Heo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 421 days.

(21) Appl. No.: 15/166,593

(22) Filed: May 27, 2016

(65) Prior Publication Data

US 2016/0351737 A1    Dec. 1, 2016

(30) Foreign Application Priority Data

May 28, 2015  (KR) .................. 10-2015-0075206

(51) Int. Cl.
  *H01L 31/18*   (2006.01)
  *H01L 31/068*  (2012.01)
  (Continued)

(52) U.S. Cl.
  CPC ............ *H01L 31/022441* (2013.01); *H01L 31/02167* (2013.01); *H01L 31/0682* (2013.01); *H01L 31/0745* (2013.01); *H01L 31/0747* (2013.01); *H01L 31/1804* (2013.01); *H01L 31/1864* (2013.01); *Y02E 10/547* (2013.01); *Y02P 70/521* (2015.11)

(58) Field of Classification Search
  CPC ....... H01L 31/022441; H01L 31/02167; H01L 31/0682
  See application file for complete search history.

(56) References Cited

U.S. PATENT DOCUMENTS 7,468,485 B1    12/2008  Swanson
2012/0322199 A1 12/2012  Graff
(Continued)

FOREIGN PATENT DOCUMENTS

CN    102637767 A    8/2012
CN    105322042 A    2/2016
(Continued)

*Primary Examiner* — Zandra V Smith
*Assistant Examiner* — Andre C Stevenson
(74) *Attorney, Agent, or Firm* — Birch, Stewart, Kolasch & Birch, LLP

(57) ABSTRACT

Disclosed is a method of manufacturing a solar cell, the method including forming a tunneling layer over one surface of a semiconductor substrate, forming a semiconductor layer over the tunneling layer, forming a conductive area including a first conductive area of a first conductive type and a second conductive area of a second conductive type in the semiconductor layer, and forming an electrode including a first electrode connected to the first conductive area and a second electrode connected to the second conductive area. The forming of the conductive area includes forming a mask layer over the semiconductor layer, forming a doping opening corresponding to at least one of the first conductive area and the second conductive area in the mask layer using a laser, and performing doping using the doping opening.

11 Claims, 9 Drawing Sheets

(51) Int. Cl.
  *H01L 31/0216* (2014.01)
  *H01L 31/0224* (2006.01)
  *H01L 31/0745* (2012.01)
  *H01L 31/0747* (2012.01)

(56) References Cited

U.S. PATENT DOCUMENTS

2014/0251817 A1* 9/2014 Vais .................... C25D 17/008
                                                    205/157
2014/0338747 A1   11/2014 Choi et al.

FOREIGN PATENT DOCUMENTS

| EP | 2 822 041 A1 | 1/2015 |
| EP | 2 980 858 A2 | 2/2016 |
| JP | 2014-112600 A | 6/2014 |
| JP | 2015-15472 A | 1/2015 |
| KR | 10-2016-0034061 A | 3/2016 |
| KR | 10-2016-0034062 A | 3/2016 |

* cited by examiner (a) (b)

SOLAR CELL AND METHOD OF MANUFACTURING THE SAME

CROSS-REFERENCE TO RELATED APPLICATION

This application claims the priority benefit of Korean Patent Application No. 10-2015-0075206, filed on May 28, 2015 in the Korean Intellectual Property Office, the disclosures of which is incorporated herein by reference.

BACKGROUND OF THE INVENTION

1. Field of the Invention

Embodiments of the present invention relate to a solar cell and a method of manufacturing the same, and more particularly, to a back contact solar cell and a method of manufacturing the same.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

Solar cells may be manufactured by forming various layers and electrodes based on a design. The efficiency of solar cells may be determined by the design of the various layers and electrodes. In order for solar cells to be commercialized, the problems of low efficiency and low productivity need to be overcome, and thus, there is a demand for solar cells, which have maximized efficiency.

SUMMARY OF THE INVENTION

Therefore, the embodiments of the present invention have been made in view of the above problems, and it is an object of the embodiments of the present invention to provide a solar cell having high efficiency and a method of manufacturing the same.

In accordance with an aspect of the present invention, the above and other objects can be accomplished by the provision of a method of manufacturing a solar cell, the method including forming a tunneling layer over one surface of a semiconductor substrate, forming a semiconductor layer over the tunneling layer, forming a conductive area including a first conductive area of a first conductive type and a second conductive area of a second conductive type in the semiconductor layer, and forming an electrode including a first electrode connected to the first conductive area and a second electrode connected to the second conductive area, wherein the forming of the conductive area includes forming a mask layer over the semiconductor layer, forming a doping opening corresponding to at least one of the first conductive area and the second conductive area in the mask layer using a laser, and performing doping using the doping opening.

In accordance with another aspect of the present invention, there is provided a solar cell including a semiconductor substrate, a tunneling layer formed over the semiconductor substrate, a conductive area located over the tunneling layer, the conductive area including a first conductive area of a first conductive type and a second conductive area of a second conductive type, and an electrode including a first electrode connected to the first conductive area and a second electrode connected to the second conductive area, wherein a mark is located in at least one of the first conductive area and the second conductive area, and has a different shape from that of a crystal plane of the semiconductor substrate and the conductive area, and wherein the mark is formed along a longitudinally extending edge of at least one of the first conductive area and the second conductive area.

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE EMBODIMENTS

Figure 1:
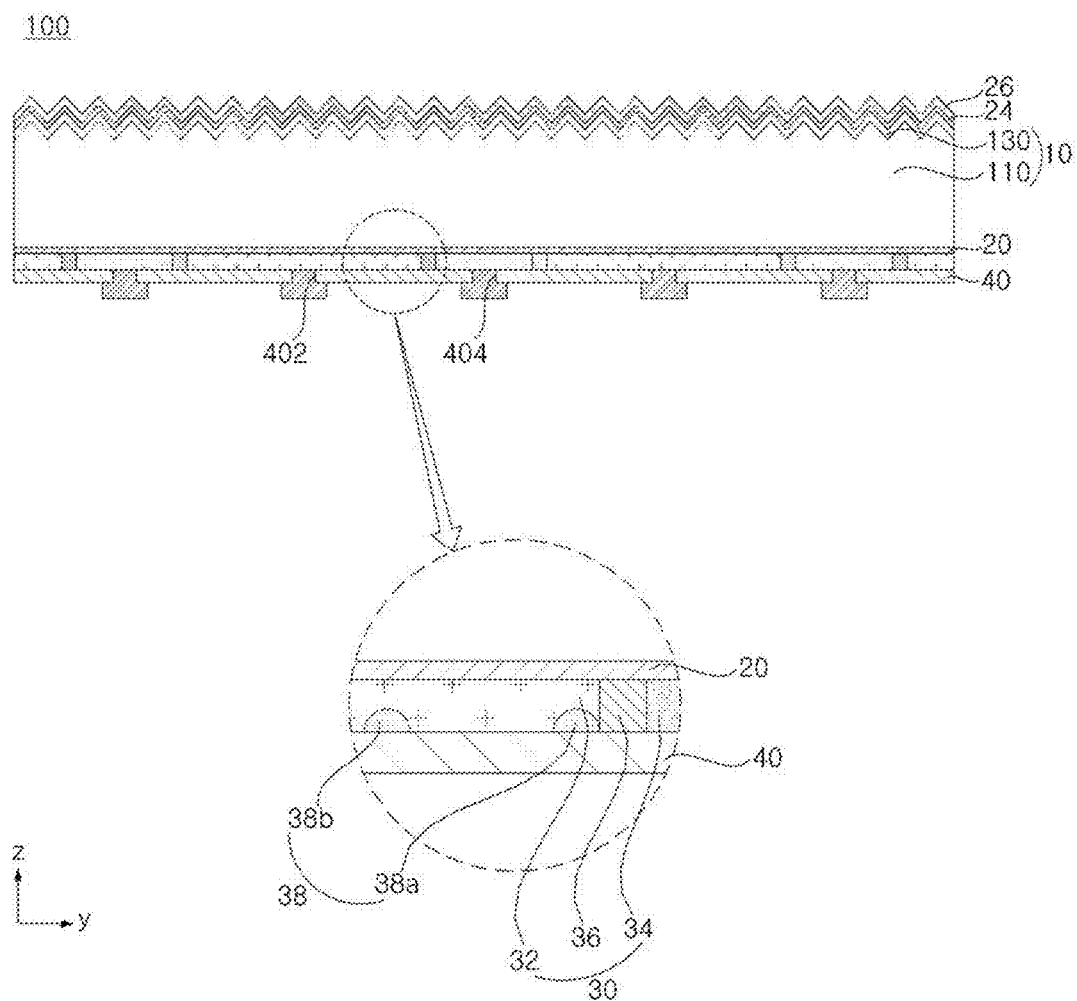
FIG. 1 is a sectional view illustrating a solar cell in accordance with an embodiment of the present invention.

Reference will now be made in detail to the embodiments of the present invention, examples of which are illustrated in the accompanying drawings. However, it will be understood that the present invention should not be limited to the embodiments and may be modified in various ways.

In the drawings, to clearly and briefly explain the embodiments of the present invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the embodiments of the present invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell and a method of manufacturing the same in accordance with the embodiments of the present invention will be described in detail with reference to the accompanying drawings.

Figure 2:
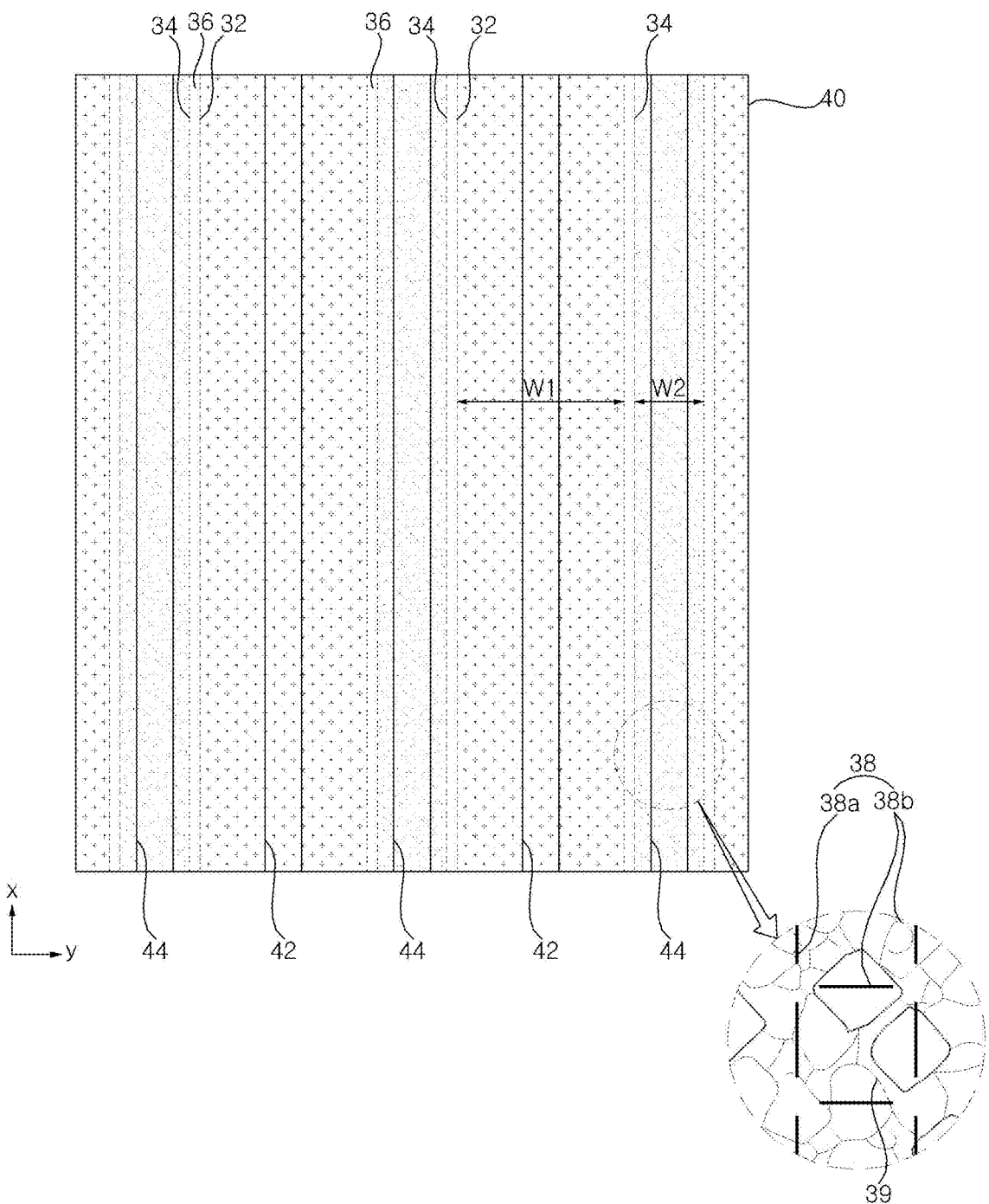
FIG. 2 is a partial rear plan view of the solar cell illustrated in FIG. 1.

FIG. 1 is a sectional view illustrating a solar cell in accordance with an embodiment of the present invention, and FIG. 2 is a partial rear plan view of the solar cell illustrated in FIG. 1.

Referring to FIGS. 1 and 2, the solar cell, designated by reference numeral 100, in accordance with the present embodiment includes a semiconductor substrate 10, a tunneling layer 20 formed over one surface (hereinafter referred to as a "back surface") of the semiconductor substrate 10, conductive areas 32 and 34 disposed over the tunneling layer 20, and electrodes 42 and 44 electrically connected to the conductive areas 32 and 34. Here, the conductive areas 32 and 34 include a first conductive area 32 of a first conductive type and a second conductive area 34 of a second conductive type, and the electrodes 42 and 44 include a first electrode 42 connected to the first conductive area 32 and a second electrode 44 connected to the second conductive area 34. At this time, in the present embodiment, laser marks (or marks) 38 are located in at least one of the first conductive area 32 and the second conductive area 34, the laser marks 38 having a different shape from that of a crystal plane 39 of the semiconductor substrate 10 and the conductive areas 32 and 34. In addition, the solar cell 100 may further include, for example, a back surface passivation film 40 disposed over the conductive areas 32 and 34, and a passivation film (hereinafter referred to as a "front surface passivation film") 24 and an anti-reflection film 26, which are disposed over the other surface (hereinafter referred to as a "front surface") of the semiconductor substrate 10. The components mentioned above will be described below in more detail.

The semiconductor substrate 10 may include a base area 110, which includes a second conductive dopant at a relatively low doping concentration, and thus is of the second conductive type. The base area 110 may be formed of crystalline semiconductors including the second conductive dopant. In one example, the base area 110 may be formed of monocrystalline or polycrystalline semiconductors (e.g., monocrystalline or polycrystalline silicon) including the second conductive dopant. In particular, the base area 110 may be formed of monocrystalline semiconductors (e.g., a monocrystalline semiconductor wafer, and for example, a semiconductor silicon wafer) including the second conductive dopant. As such, excellent electrical properties may be accomplished based on the base area 110 or the semiconductor substrate 10, which has high crystallinity and thus little defects.

The second conductive type may be a p-type or an n-type. In one example, when the base area 110 is of an n-type, the first conductive area 32 of a p-type may be widely formed so as to form a junction (e.g., a pn junction, which produces carriers via photoelectric conversion) along with the base area 110 with the tunneling layer 20 interposed therebetween, which may result in an increased photoelectric conversion area. In this instance, the first conductive area 32, which has a wide area, may effectively collect holes, which move relatively slowly, thereby contributing to further improvement in the photoelectric conversion efficiency. However, the embodiment of the present invention is not limited thereto.

In addition, the semiconductor substrate 10 may include a front surface field area (or field area) 130 disposed on the front surface of the semiconductor substrate 10. The front surface field area 130 may be of the same conductive type as that of the base area 110, and may have a higher doping concentration than the base area 110.

The present embodiment illustrates that the front surface field area 130 is configured as a doping area, which is formed by doping the semiconductor substrate 10 with a second conductive dopant at a relatively high doping concentration. As such, the front surface field area 130 includes second conductive crystalline (monocrystalline or polycrystalline) semiconductors and constitutes a part of the semiconductor substrate 10. In one example, the front surface field area 130 may constitute a part of a second conductive monocrystalline semiconductor substrate (e.g., a monocrystalline silicon wafer substrate). At this time, the doping concentration of the front surface field area 130 may be smaller than the doping concentration of the second conductive area 34, which is of the same second conductive type as that of the front surface field area 130.

However, the embodiment of the present invention is not limited thereto. Thus, the front surface field area 130 may be formed by doping a separate semiconductor layer (e.g., an amorphous semiconductor layer, a microcrystalline semiconductor layer, or a polycrystalline semiconductor layer), rather than the semiconductor substrate 10, with a second conductive dopant. Alternatively, the front surface field area 130 may be configured as a field area, which functions similar to a layer (e.g., the front surface passivation film 24 and/or the anti-reflection film 26), which is formed close to the semiconductor substrate 10 and is doped with a fixed charge. For example, when the base area 110 is of an n-type, the front surface passivation film 24 may be formed of an oxide (e.g., an aluminum oxide) having a fixed negative charge, so as to form an inversion layer on the surface of the base area 110. As such, the front surface passivation film 24 may be used as a field area. In this instance, the semiconductor substrate 10 may include only the base area 110 without a separate doping area, which may minimize defects of the semiconductor substrate 10. The front surface field area 130 having various configurations may be formed using various other methods.

In the present embodiment, the front surface of the semiconductor substrate 10 may be subjected to texturing, and thus, may have protrusions having, for example, a pyramidal shape. The texturing structure formed on the semiconductor substrate 10 may have a given shape (e.g., a pyramidal shape), the outer surface of which is formed along the specific crystalline plane (e.g., (111) plane) of semiconductors. In the instance where the surface roughness is increased by forming protrusions on, for example, the front surface of the semiconductor substrate 10 via texturing, it is possible to reduce the reflectance of light introduced through the front surface of the semiconductor substrate 10. In this way, the quantity of light that reaches the pn junction, which is formed by the base area 110 and the first conductive area 32, may be increased, which may minimize the loss of light.

In addition, the back surface of the semiconductor substrate 10 may be formed into a relatively smooth flat surface having a lower surface roughness than the front surface via, for example, mirror surface grinding. This is because the properties of the solar cell 100 may considerably vary according to the properties of the back surface of the semiconductor substrate 10 in the instance where both the first and second conductive areas 32 and 34 are formed on the back surface of the semiconductor substrate 10 as in the present embodiment. Accordingly, the back surface of the semiconductor substrate 10 is not provided with the protrusions formed by texturing, so as to achieve improved passivation, which may consequently improve the properties of the solar cell 100. However, the embodiment of the present invention is not limited thereto. In some instances, the back surface of the semiconductor substrate 10 may be provided with protrusions formed by texturing. Various other alterations or alternatives are possible.

The tunneling layer 20 may be formed over the back surface of the semiconductor substrate 10. In one example, the tunneling layer 20 may be formed so as to come into contact with the back surface of the semiconductor substrate 10, which may result in a simplified configuration and improved tunneling effects. However, the embodiment of the present invention is not limited thereto.

The tunneling layer 20 serves as a barrier for electrons and holes, thereby preventing minority carriers from passing therethrough and allowing only majority carriers, which accumulate at a portion adjacent to the tunneling layer 20 and thus have a given amount of energy or more, to pass therethrough. At this time, the majority carriers, which have the given amount of energy or more, may easily pass through the tunneling layer 20 owing to tunneling effects. In addition, the tunneling layer 20 may serve as a diffusion barrier, which prevents the dopant of the conductive areas 32 and 34 from being diffused to the semiconductor substrate 10. The tunneling layer 20 may include various materials to enable the tunneling of the majority carriers. In one example, the tunneling layer 20 may include an oxide, a nitride, semiconductors, and a conductive polymer. In particular, the tunneling layer 20 may be a silicon oxide layer, which is formed of a silicon oxide. This is because the silicon oxide layer has excellent passivation and thus ensures easy tunneling of carriers.

At this time, the tunneling layer 20 may be formed throughout the back surface of the semiconductor substrate 10. Accordingly, the tunneling layer 20 may be easily formed without additional patterning.

In order to achieve sufficient tunneling effects, the tunneling layer 20 may be thinner than the back surface passivation film 40. In one example, the thickness of the tunneling layer 20 may be 5 nm or less (for example, 2 nm or less, for example, within a range from 0.5 nm to 2 nm). When the thickness T of the tunneling layer 20 exceeds 5 nm, smooth tunneling does not occur, and consequently, the solar cell 100 cannot operate. When the thickness of the tunneling layer 20 is below 0.5 nm, it may be difficult to form the tunneling layer 20 having the desired quality. In order to further improve tunneling effects, the thickness of the tunneling layer 20 may be 2 nm or less (for example, within a range from 0.5 nm to 2 nm). At this time, in order to ensure that the tunneling layer 20 exerts sufficient effects, the thickness of the tunneling layer 20 may be within a range from 0.5 nm to 1.2 nm. However, the embodiment of the present invention is not limited thereto, and the thickness of the tunneling layer 20 may have any of various values.

A semiconductor layer 30 including the conductive areas 32 and 34 may be disposed over the tunneling layer 20. In one example, the semiconductor layer 30 may be formed so as to come into contact with the tunneling layer 20, which may result in a simplified configuration and maximized tunneling effects. However, the embodiment of the present invention is not limited thereto.

In the present embodiment, the semiconductor layer 30 may include the first conductive area 32, which includes a first conductive dopant and thus exhibits a first conductive type, and the second conductive area 34, which includes a second conductive dopant and thus exhibits a second conductive type. The first conductive area 32 and the second conductive area 34 may be located in the same plane over the tunneling layer 20. That is, no layer may be interposed between the first and second conductive areas 32 and 34 and the tunneling layer 20, or when another layer is interposed between the first and second conductive areas 32 and 34 and the tunneling layer 20, a portion of the interposed layer over the first conductive area 32 and a portion of the interposed layer over the second conductive area 34 may have the same stack structure. In addition, a barrier area 36 may be located between the first conductive area 32 and the second conductive area 34 in the same plane as that of the first and second conductive areas 32 and 34.

The first conductive area 32 forms the pn junction (or pn tunnel junction) along with the base area 110 with the tunneling layer 20 interposed therebetween, thereby constituting an emitter area, which produces carriers via photoelectric conversion.

At this time, the first conductive area 32 may include semiconductors (e.g., silicon), which include a first conductive dopant opposite to the conductive type of the base area 110. In the present embodiment, the first conductive area 32 is formed of a semiconductor layer doped with a first conductive dopant, which is formed over the semiconductor substrate 10 (more particularly, over the tunneling layer 20) separately from the semiconductor substrate 10. As such, the first conductive area 32 may be formed of a semiconductor layer, which has a different crystalline structure from that of the semiconductor substrate 10, in order to be easily formed on the semiconductor substrate 10. For example, the first conductive area 32 may be formed by doping an amorphous semiconductor layer, a microcrystalline semiconductor layer, or a polycrystalline semiconductor layer (e.g., an amorphous silicon layer, a microcrystalline silicon layer, or a polycrystalline silicon layer), which may be easily manufactured by various methods such as, for example, deposition, with a first conductive dopant. The first conductive dopant may be added to the semiconductor layer in the process of forming the semiconductor layer, or may be added to the semiconductor layer after the semiconductor layer is formed, through the use of various doping methods such as, for example, thermal diffusion and ion implantation.

At this time, the first conductive area 32 may include a first conductive dopant, which is opposite to a conductive type of the base area 110. That is, when the first conductive dopant is of a p-type, the dopant may be selected from among group III elements such as, for example, boron (B), aluminum (Al), gallium (Ga), and indium (In). When the first conductive dopant is of an n-type, the dopant may be selected from among group V elements such as, for example, phosphorus (P), arsenic (As), bismuth (Bi), and antimony (Sb). In one example, the first conductive dopant may be boron (B) of a p-type.

The second conductive area 34 is a back surface field area, which forms a back surface field so as to prevent the loss of carriers due to recombination on the surface of the semiconductor substrate 10 (more accurately, on the back surface of the semiconductor substrate 10).

At this time, the second conductive area 34 may include semiconductors (e.g., silicon), which include a second conductive dopant, the conductive type of which is the same as the conductive type of the base area 110. In the present embodiment, the second conductive area 34 is formed of a semiconductor layer doped with a second conductive dopant, which is formed over the semiconductor substrate 10 (more particularly, over the tunneling layer 20) separately from the semiconductor substrate 10. As such, the second conductive area 34 may be formed of a semiconductor layer, which has a different crystalline structure from that of the semiconductor substrate 10, in order to be easily formed on the semiconductor substrate 10. For example, the second conductive area 34 may be formed by doping an amorphous semiconductor layer, a microcrystalline semiconductor layer, or a polycrystalline semiconductor layer (e.g., an amorphous silicon layer, a microcrystalline silicon layer, or a polycrystalline silicon layer), which may be easily manufactured by various methods such as, for example, deposition, with a second conductive dopant. The second conductive dopant may be added to the semiconductor layer in the process of forming the semiconductor layer, or may be added to the semiconductor layer after the semiconductor layer is formed, through the use of various doping methods such as, for example, thermal diffusion and ion implantation.

At this time, the second conductive area 34 may include a second conductive dopant, which is of the same conductive type as that of the base area 110. That is, when the second conductive dopant is of an n-type, the dopant may be selected from among group V elements such as, for example, phosphorus (P), arsenic (As), bismuth (Bi), and antimony (Sb). When the second conductive dopant is of a p-type, the dopant may be selected from among group III elements such as, for example, boron (B), aluminum (Al), gallium (Ga), and indium (In). In one example, the second conductive dopant may be phosphorus (P) of an n-type.

In addition, the barrier area 36 is located between the first conductive area 32 and the second conductive area 34 so that the first conductive area 32 and the second conductive area 34 are spaced apart from each other by the barrier area 36. When the first conductive area 32 and the second conductive area 34 come into contact with each other, shunt may occur, which causes deterioration in the performance of the solar cell 100. Accordingly, in the present embodiment, the barrier area 36 may be located between the first conductive area 32 and the second conductive area 34 so as to prevent unnecessary shunt.

The barrier area 36 may include any of various materials, which may substantially insulate the first conductive area 32 and the second conductive area 34 from each other. That is, the barrier area 36 may be formed of, for example, an undoped insulation material (e.g., an oxide or a nitride). Alternatively, the barrier area 36 may include intrinsic semiconductors. At this time, the first conductive area 32, the second conductive area 34, and the barrier area 36 are formed of the same semiconductors (e.g., amorphous silicon, microcrystalline silicon or polycrystalline silicon), so as to be successively formed and to come into contact at side surfaces thereof with one another, and the barrier area 36 may be formed of i-type (intrinsic) semiconductors, which substantially include no dopant. In one example, when a semiconductor layer, which includes a semiconductor material, is formed, and then a portion of the semiconductor layer is doped with a first conductive dopant so as to form the first conductive area 32 and a portion of the remaining semiconductor layer is doped with a second conductive dopant so as to form the second conductive area 34, the resulting remaining portion at which the first conductive area 32 and the second conductive area 34 are not formed may constitute the barrier area 36. In this way, the formation of the first conductive area 32, the second conductive area 34 and the barrier area 36 may be simplified.

However, the embodiment of the present invention is not limited thereto. Thus, when the barrier area 36 is formed separately from the first conductive area 32 and the second conductive area 34, the thickness of the barrier area 36 may differ from those of the first conductive area 32 and the second conductive area 34. In one example, in order to more effectively prevent short circuits of the first conductive area 32 and the second conductive area 34, the barrier area 36 may be thicker than the first conductive area 32 and the second conductive area 34. Alternatively, in order to reduce materials required to form the barrier area 36, the barrier area 36 may be thinner than the first conductive area 32 and the second conductive area 34. Of course, various other alterations or alternatives are possible. In addition, the basic constituent material of the barrier area 36 may differ from those of the first conductive area 32 and the second conductive area 34.

In addition, the present embodiment illustrates that the first conductive area 32 and the second conductive area 34 are wholly spaced apart from each other by the barrier area 36. However, the embodiment of the present invention is not limited thereto. Accordingly, the barrier area 36 may be formed so as to cause the first conductive area 32 and the second conductive area 34 to be spaced apart from each other only at a portion of the boundary therebetween. Thereby, the first conductive area 32 and the second conductive area 34 may come into contact with each other at the remaining boundary therebetween.

In this instance, the first conductive area 32, which is of a different conductive type from that of the base area 110, may be wider than the second conductive area 34, which is of the same conductive type as that of the base area 110. As such, a wider pn junction may be formed between the base area 110 and the first conductive area 32 through the tunneling layer 20. At this time, when the conductive type of the base area 110 and the second conductive area 34 is an n-type and the conductive type of the first conductive area 32 is a p-type, holes, which relatively slowly move, may be effectively collected by the wide first conductive area 32. The plan configuration of the first conductive area 32, the second conductive area 34, and the barrier area 36 will be described later in more detail with reference to FIG. 2.

The back surface passivation film 40 may be formed over the first and second conductive areas 32 and 34 and the barrier area 36 on the back surface of the semiconductor substrate 10. In one example, the back surface passivation film 40 may be in contact with the first and second conductive areas 32 and 34 and the barrier area 36 so as to achieve a simplified configuration. However, the embodiment of the present invention is not limited thereto.

The back surface passivation film 40 includes contact portions 402 and 404 for the electrical connection of the conductive areas 32 and 34 and the electrodes 42 and 44. The contact portions 402 and 404 include a first contact portion 402 for the connection of the first conductive area 32 and the first electrode 42, and a second contact portion 404 for the connection of the second conductive area 34 and the second electrode 44. As such, the back surface passivation film 40 serves to prevent the first conductive area 32 and the second conductive area 34 from being connected to incorrect electrodes (i.e. the second electrode 44 in the instance of the first conductive area 32 and the first electrode 42 in the instance of the second conductive area 34). In addition, the back surface passivation film 40 may have the passivation effects of the first and second conductive areas 32 and 34 and/or the barrier area 36.

The back surface passivation film 40 may be a single film or a multilayered film, which includes, for example, a silicon oxide, silicon nitride, silicon oxide nitride, silicon carbide, or amorphous silicon.

The back surface passivation film 40 may be located on a portion of the semiconductor layer 30 at which the electrodes 42 and 44 are not located. The back surface passivation film 40 may be thicker than the tunneling layer 20. This may result in improved insulation and passivation properties. Various other alterations or alternatives are possible.

In one example, in the present embodiment, the front surface passivation film 24 and/or the anti-reflection film 26, and the back surface passivation film 40 may include no dopant, in order to achieve excellent insulation and passivation properties.

The electrodes 42 and 44, which are disposed on the back surface of the semiconductor substrate 10, include the first electrode 42, which is electrically and physically connected to the first conductive area 32, and the second electrode 44, which is electrically and physically connected to the second conductive area 34.

The first and second electrodes 42 and 44 may include various metal materials. In addition, the first and second electrodes 42 and 44 may have any of various other plan shapes such that they are not electrically connected to each other, but are connected respectively to the first conductive area 32 and the second conductive area 34 so as to collect and transmit produced carriers to the outside. That is, the embodiment of the present invention is not limited as to the plan shape of the first and second electrodes 42 and 44.

Hereinafter, one example of the plan shape of the first conductive area 32, the second conductive area 34, the barrier area 36, and the first and second electrodes 42 and 44 will be described in detail with reference to FIGS. 1 and 2.

Referring to FIGS. 1 and 2, in the present embodiment, the first conductive area 32 and the second conductive area 34 have an elongated shape so as to form stripes respectively, and are alternately arranged in the direction crossing the longitudinal direction thereof. The barrier area 36 may be located between the first conductive area 32 and the second conductive area 34 so that the first and second conductive areas 32 and 34 are spaced apart from each other by the barrier area 36. In FIGS. 1 and 2, a plurality of first conductive areas 32, which are spaced apart from one another, may be connected to one another at one edge, and a plurality of second conductive areas 34, which are spaced apart from one another, may be connected to one another at an opposite edge. However, the embodiment of the present invention is not limited thereto.

At this time, as described above, the first conductive area 32 may be wider than the second conductive area 34. In one example, the areas of the first conductive area 32 and the second conductive area 34 may be adjusted by providing the first and second conductive areas 32 and 34 with different widths. That is, the width W1 of the first conductive area 32 may be greater than the width W2 of the second conductive area 34.

In addition, the first electrode 42 may have a stripe shape so as to correspond to the first conductive area 32, and the second electrode 44 may have a stripe shape so as to correspond to the second conductive area 34. Various other alterations or alternatives are possible. In addition, in FIGS. 1 and 2, a plurality of first electrodes 42 may be connected to one another at one end, and a plurality of second electrodes may be connected to one another at an opposite edge. However, the embodiment of the present invention is not limited thereto.

Referring again to FIG. 1, the front surface passivation film 24 and/or the anti-reflection film 26 may be disposed over the front surface of the semiconductor substrate 10 (more accurately, over the front surface field area 130 formed on the front surface of the semiconductor substrate 10). In some embodiments, only the front surface passivation film 24 may be formed over the semiconductor substrate 10, only the anti-reflection film 26 may be formed over the semiconductor substrate 10, or the front surface passivation film 24 and the anti-reflection film 26 may be sequentially disposed over the semiconductor substrate 10. FIG. 1 illustrates that the front surface passivation film 24 and the anti-reflection film 26 may be sequentially formed over the semiconductor substrate 10 such that the semiconductor substrate 10 comes into contact with the front surface passivation film 24. However, the embodiment of the present invention is not limited thereto, and the semiconductor substrate 10 may come into contact with the anti-reflection film 26. Various other alterations or alternatives are possible.

The front surface passivation film 24 and the anti-reflection film 26 may substantially be formed throughout the front surface of the semiconductor substrate 10. Here, the expression "formed throughout the front surface" includes the meaning of being physically completely formed over the entire front surface as well as the meaning of being formed so as to inevitably exclude a portion thereof.

The front surface passivation film 24 is formed so as to come into contact with the front surface of the semiconductor substrate 10, thereby causing the passivation of defects in a bulk or the front surface of the semiconductor substrate 10. As such, it is possible to increase the opening voltage of the solar cell 100 by removing recombination sites of minority carriers. The anti-reflection film 26 reduces the reflectance of light introduced into the front surface of the semiconductor substrate 10. Thereby, the quantity of light, which reaches the pn junction formed on the interface between the base area 110 and the first conductive area 32, may be increased. This may increase the short circuit current Isc of the solar cell 100. As described above, through the provision of the front surface passivation film 24 and the anti-reflection film 26, the opening voltage and short circuit current of the solar cell 100 may be increased, which may result in the improved efficiency of the solar cell 100.

The front surface passivation film 24 and/or the anti-reflection film 26 may be formed of various materials. In one example, the front surface passivation film 24 and the anti-reflection film 26 may be a single film, or a multilayered film having the form of a combination of two or more films, selected from among the group of a silicon nitride film, a silicon nitride film containing hydrogen, a silicon oxide film, a silicon oxide nitride film, an aluminum oxide film, a silicon carbide film, $MgF_2$, ZnS, $TiO_2$ and $CeO_2$. In one example, the front surface passivation film 24 may be a silicon oxide film formed over the semiconductor substrate 10, and the anti-reflection film 26 may take the form of a stack in which a silicon nitride film and a silicon carbide film are stacked one above another.

Referring to FIGS. 1 and 2, in the present embodiment, the laser marks 38, which have a different shape from that of the crystal plane 39 of the semiconductor substrate 10 and the first and second conductive areas 32 and 34, may be located in at least one of the first and second conductive areas 32 and 34. This is because the laser marks 38 remain in the semiconductor layer 30 (or see reference numeral 300 in FIG. 4G) when a laser is used to pattern a first doping layer (see reference numeral 310 in FIG. 4E) for the formation or doping of the first conductive area 32 and/or a mask layer (see reference numeral 314 in FIG. 4G) for the formation or doping of the second conductive area 34. The process of forming the first and second conductive areas 32 and 34 will be described in detail later with regard to the manufacturing method.

Hereinafter, the instance where a second opening (see reference numeral 314a in FIG. 4G) is formed in the mask layer 314 via laser etching in order to expose a corresponding portion of the second conductive area 34, thus causing the laser marks 38 in the second conductive area 34 will be described by way of example.

The laser marks 38 are locations that are melted by a laser and are then again crystallized, thus having a different crystalline structure and/or crystal grain structure from that of the surrounding portion, and therefore are perceived differently from the surrounding portion when using, for example, a microscope. The laser marks 38 have no negative effect on the properties of the semiconductor layer 30. For example, when viewing the laser marks 38 using a microscope, the laser marks 38 may have a different shape from that of the crystal plane 39 of the semiconductor substrate 10 and the semiconductor layer 30 (or the first and second conductive areas 32 and after doping), and may be seen or perceived to be darker or brighter than the surrounding portion.

The laser marks 38 may have a high possibility of being locally formed on some locations in the area onto which the laser is radiated, rather than being formed on the entire area. That is, the laser marks 38 may mainly include outer laser marks (or outer marks) 38a, which are formed along the edge of the second conductive area 34. In addition, the laser marks 38 may further include inner laser marks (or inner marks) 38b, which are formed inside the second conductive area 34. Although the enlarged circle of FIG. 1 illustrates that the laser marks 38 include the outer laser mark 38a and the inner laser mark 38b, which are present at arbitrary locations in the thickness direction of the conductive areas 32 and 34, this is merely a schematic illustration for a clear description, and the embodiment of the present invention is not limited thereto. That is, it may be difficult in practice to check the laser marks 38 in the cross section of the conductive areas 32 and 34, and the laser marks 38 may be formed through the entire thickness of the conductive areas 32 and 34 so as to penetrate the thickness of the conductive areas 32 and 34.

In the present embodiment, the laser marks 38 are not formed when the contact portions 402 and 404, which penetrate the first and second electrodes 42 and 44 for the connection of the electrodes 42 and 44 and the conductive areas 32 and 34, are formed, but are formed when the conductive areas 32 and 34 are formed. As such, the laser marks 38 may be formed with no relation with the contact portions 402 and 404. In particular, because the outer laser marks 38a are located near the edges of the conductive area 32 and 34, the outer laser marks 38a may be located outside the contact portions 402 and 404, which are smaller than the conductive areas 32 and 34, and may be spaced apart from the contact portions 402 and 404. In addition, because the inner laser marks 38b have no relation with the contact portions 402 and 404, the inner laser marks 38b may be provided at locations where the contact portions 402 and 404 are formed, or may be provided at locations where the contact portions 402 and 404 are not formed.

However, the embodiment of the present invention is not limited thereto. Thus, unlike the present embodiment, when the contact portions 402 and 404 have the same or similar width or area compared to the conductive areas 32 and 34, the outer laser marks 38a may be formed near the edges of the contact portions 402 and 404, which correspond to the edges of the conductive areas 32 and 34.

As described above, in the present embodiment, the first and second conductive areas 32 and 34 may include a plurality of areas formed parallel to one another, and thus may have a stripe arrangement. In this instance, the outer laser marks 38a may take the form of lines that extend a long length along opposite longitudinal edges of the second conductive area 34. However, the embodiment of the present invention is not limited thereto, and it is sufficient for the outer laser marks 38a to be formed along the edge of the second conductive area 34.

At this time, the outer laser marks 38a may be formed along the entire edge of the second conductive area 34, and may be disconnected at some portions. Even if the outer laser marks 38a have some disconnected portions, the outer laser marks 38a may be located on most (i.e. 50% or more) of the edge of the second conductive area 34.

The inner laser marks 38b, which are formed inside the second conductive area 34, may or may not be present.

When no inner laser mark 38b is present, this means that the greater portion of the second conductive area 34 (or a corresponding semiconductor layer 300) undergoes no variation in crystalline structure upon laser patterning. Therefore, it can be appreciated that the semiconductor layer 300 is not greatly affected by laser patterning. Consequently, it can be appreciated that the design properties of the second conductive area 34 are maintained.

Even when the inner laser marks 38b are present, the outer laser marks 38a may be denser than the inner laser marks 38b. That is, the density of the outer laser marks 38a (i.e. the ratio of the portion in which the outer laser marks 38a are located to the total edge area of the second conductive area 34) is greater than the density of the inner laser marks 38b (i.e. the ratio of the portion in which the inner laser marks 38b are located to the total inner area of the second conductive area 34). Although not clearly visible, it appears that the inner laser marks 38b are not greatly formed inside the second conductive area 34, on which the laser is uniformly radiated, but is formed at a relatively high density on the edge of the second conductive area 34, which is the boundary between the portion on which the laser is radiated and the portion on which the laser is not radiated.

Figure 5:
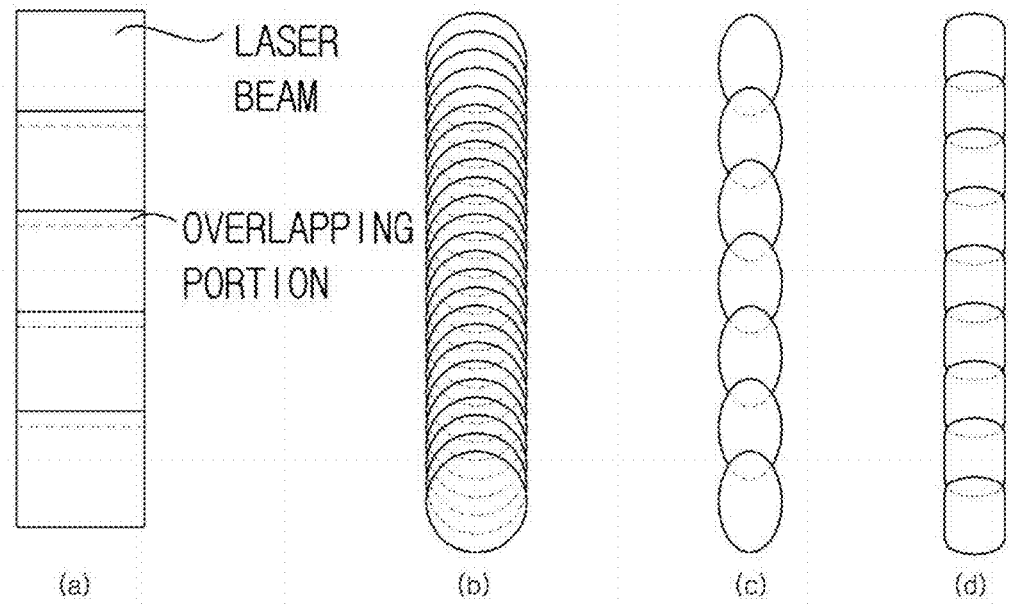
FIG. 5 illustrates sectional views illustrating a laser ablation process in the method of manufacturing the solar cell in accordance with the embodiment of the present invention.

The inner laser marks 38b may take the form of lines crossing the outer laser marks 38a. When a laser having a smaller area (more particularly, a smaller length) than the second conductive area 34 is used when the second conductive area 34 is formed, as illustrated in FIG. 5, laser beams overlap each other to remove the mask layer 314, whereby the second opening 314a is formed so as to expose a portion corresponding to the second conductive area 34. As such, the inner laser marks 38b may be formed at the locations at which the laser beams overlap each other. In this instance, the inner laser marks 38b may be formed as lines that extend in the direction crossing the outer laser marks 38a. However, the embodiment of the present invention is not limited thereto, and the inner laser marks 38b may have any of various shapes contingent on, for example, the shape of the laser beam. In addition, the inner laser marks 38b may have any of various shapes, such as a circular or irregular closed curve or a polygon.

Figure 3:
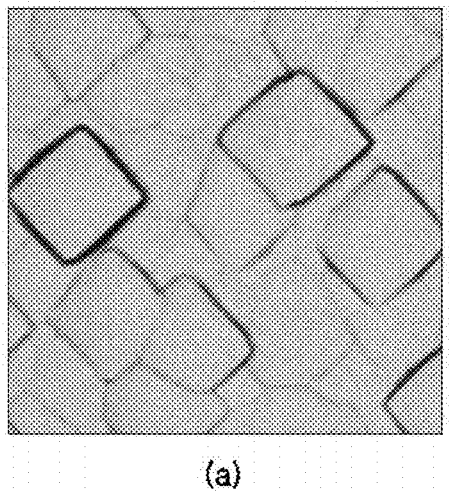
FIG. 3 is a microphotograph illustrating a solar cell in accordance with an embodiment of the present invention.
Figure 3:
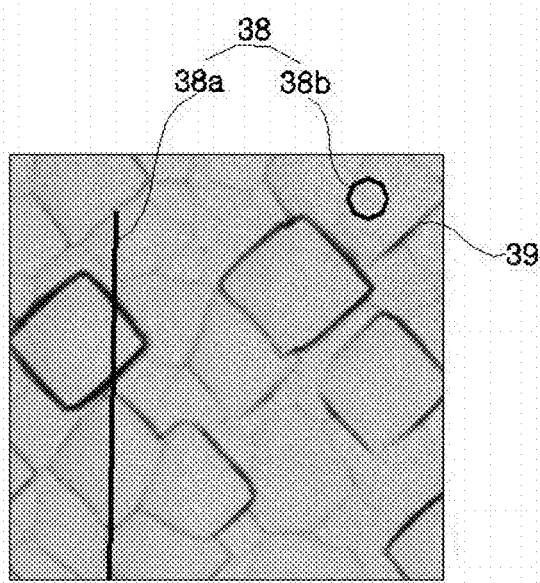

FIG. 3 is a microphotograph illustrating the solar cell 100 in accordance with an embodiment of the present invention. For more clear understanding, in FIG. 3, (a) illustrates the original microphotograph of the solar cell 100 and (b) more clearly illustrates the laser marks 38. Referring to FIG. 3, because pyramidal protrusions are formed on the front surface of the semiconductor substrate 10 via texturing, the crystal plane 39 is seen to have an approximately square shape so as to correspond to the bottom of the pyramidal protrusion. In addition, it can be appreciated that the outer laser marks 38a, which take the form of long lines having a different shape from that of the crystal plane 39 of the semiconductor substrate 10, and the inner laser marks 38b, which have an approximately circular shape, are located.

The above-described embodiment illustrates that the laser marks 38 are located in the second conductive area 34, which is of a different conductive type from that of the base area 110, among the first and second conductive areas 32 and 34, and that no laser marks 38 are located in the first conductive area 32, which is of the same conductive type as that of the base area 110. In this instance, the laser may be used to form the second opening 314a for the second conductive area 32, which forms a back surface field area and has a relatively small area, which may reduce, for example, the process time of laser patterning.

However, the embodiment of the present invention is not limited thereto. Thus, the first conductive area 32 may include the laser marks 38 and the second conductive area 34 may have no laser marks 38. That is, the laser marks 38 may be formed on the edge of the first conductive area 32 and may not be formed on the edge of the second conductive area 34. This is because, upon the formation of the first conductive area 32, an opening for exposing the portion corresponding to the first conductive area 32 is formed using a laser, and the patterning of the mask layer 314 for forming the second conductive area 34 is not performed using a laser. Alternatively, each of the first and second conductive areas 32 and 34 may have the laser marks 38. That is, the outer laser marks 38a may be formed on the edges of the first and second conductive areas 32 and 34 and the inner laser marks 38b may or may not be formed on at least one of the first and second conductive areas 32 and 34. Various other alterations or alternatives are possible.

When light is introduced to the solar cell 100 in accordance with the present embodiment, electrons and holes are produced via photo-electric conversion at the pn junction, which is formed between the base area 110 and the first conductive area 32, and the produced electrons and holes move to the first conductive area 32 and the second conductive area 34 by tunneling through the tunneling layer 20, and thereafter move to the first and second electrodes 42 and 44. In this way, electrical energy is produced.

The back contact solar cell 100, in which the electrodes 42 and 44 are formed on the back surface of the semiconductor substrate 10 and no electrodes are formed on the front surface of the semiconductor substrate 10, as in the present embodiment may minimize shading loss on the front surface of the semiconductor substrate 10. Thereby, the efficiency of the solar cell 100 may be improved. However, the embodiment of the present invention is not limited thereto.

In addition, because the first and second conductive areas 32 and 34 are formed over the semiconductor substrate 10 with the tunneling layer 20 interposed therebetween, the first and second conductive areas 32 and 34 are configured as a layer separate from the semiconductor substrate 10. As such, light loss due to recombination may be minimized compared to the instance where a doping area, formed by doping the semiconductor substrate 10 with a dopant, is used as a conductive area.

In addition, the laser marks 38 are formed on at least one of the first and second conductive areas 32 and 34 using a laser during the patterning that is performed to form at least one of the first and second conductive areas 32 and 34. Because the damage is very small compared to the damage caused by wet etching even if the laser marks 38 are made, the patterning using a laser may minimize damage to the first and second conductive areas 32 and 34. Thereby, the efficiency of the solar cell 100 may be improved. In addition, the use of a laser may simplify the manufacturing method, resulting in improved productivity. This will be described later in more detail in connection with the method of manufacturing the solar cell 100.

The method of manufacturing the solar cell 100 having the above-described configuration will be described in detail with reference to FIGS. 4A to 4K. FIGS. 4A to 4K are sectional views illustrating the method of manufacturing the solar cell in accordance with an embodiment of the present invention.

Figure 4A:
FIGS. 4A to 4K are sectional views illustrating a method of manufacturing a solar cell in accordance with an embodiment of the present invention.

First, as illustrated in FIG. 4A, a tunneling layer 20 is formed on the back surface of a semiconductor substrate 10, which includes a base area 110 having a second conductive dopant.

In the present embodiment, the semiconductor substrate 10 may be a silicon substrate (e.g., a silicon wafer) having an n-type dopant. The n-type dopant may be selected from among group V elements such as, for example, phosphorus (P), arsenic (As), bismuth (Bi), and antimony (Sb). However, the embodiment of the present invention is not limited thereto, and the base area 110 may have a p-type dopant.

The tunneling layer 20 may be formed throughout the back surface of the semiconductor substrate 10. Here, the tunneling layer 20 may be formed via, for example, thermal growth or chemical deposition (e.g., plasma enhanced chemical vapor deposition (PECVD) or low pressure chemical vapor deposition (LPCVD)). However, the embodiment of the present invention is not limited thereto, and the tunneling layer 20 may be formed via various other methods.

Although FIG. 4A illustrates that the tunneling layer 20 is formed only on the back surface of the semiconductor substrate 10, the embodiment of the present invention is not limited thereto. The tunneling layer 20 may additionally be formed on the front surface and/or the side surface of the semiconductor substrate 10 according to the method of forming the tunneling layer 20. The tunneling layer 20, which is formed on, for example, on the front surface of the semiconductor substrate 10, may be removed later in a separate operation.

Subsequently, as illustrated in FIGS. 4B to 4H, a semiconductor layer 30, which includes first and second conductive areas 32 and 34, is formed over the tunneling layer 20. Then, a texture and a front surface field area 130 may be formed on the front surface of the semiconductor substrate 10. This will be described below in more detail.

Figure 4B:
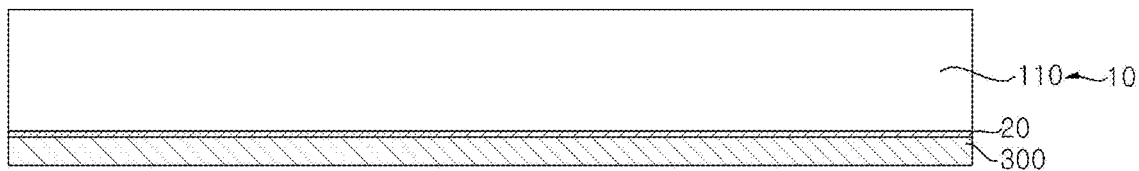

First, as illustrated in FIG. 4B, a semiconductor layer 300, which has a crystalline structure and is formed of intrinsic semiconductors, is formed over the tunneling layer 20, which has been formed on the back surface of the semiconductor substrate 10. The semiconductor layer 300 may be formed of microcrystalline, amorphous, or polycrystalline semiconductors. In one example, the semiconductor layer 300 may be formed via, for example, thermal growth or chemical deposition (e.g., PECVD or LPCVD). However, the embodiment of the present invention is not limited thereto, and the semiconductor layer 300 may be formed via various other methods.

Although FIG. 4B illustrates that the semiconductor layer 300 is formed only on the back surface of the semiconductor substrate 10, the embodiment of the present invention is not limited thereto. According to the method of forming the semiconductor layer 300, the semiconductor layer 300 may additionally be formed on the front surface and/or the side surface of the semiconductor substrate 10. The semiconductor layer 300 formed on, for example, the front surface of the semiconductor substrate 10, may be removed later in a separate operation.

Figure 4C:
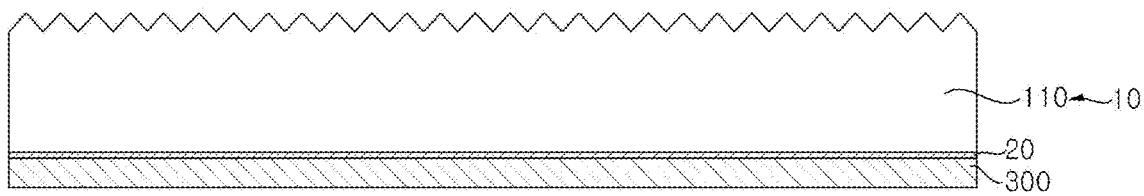

Subsequently, as illustrated in FIG. 4C, the front surface of the semiconductor substrate 10 may be subjected to texturing so that protrusions are formed on the front surface of the semiconductor substrate 10. Texturing on the front surface of the semiconductor substrate 10 may be wet or dry texturing. Wet texturing may be performed by dipping the semiconductor substrate 10 in a texturing solution. The wet texturing has an advantage of short process time. Dry texturing is the process of cutting the surface of the semiconductor substrate 10 using, for example, a diamond grill or laser, and may cause an extended process time and damage to the semiconductor substrate 10, although it may result in the formation of uniform protrusions. In addition, the semiconductor substrate 10 may be textured via, for example, reactive ion etching (RIE). As described above, in the embodiment of the present invention, the semiconductor substrate 10 may be textured via various methods.

The present embodiment illustrates that the front surface of the semiconductor substrate 10 is textured after the semiconductor layer 300 is formed and before the first and second conductive areas 32 and 34 are formed. However, the embodiment of the present invention is not limited thereto. Thus, the front surface of the semiconductor substrate 100 may be textured before the semiconductor layer 300 is formed, after the first and second conductive areas 32 and 34 are formed, or in a separate process.

Figure 4D:
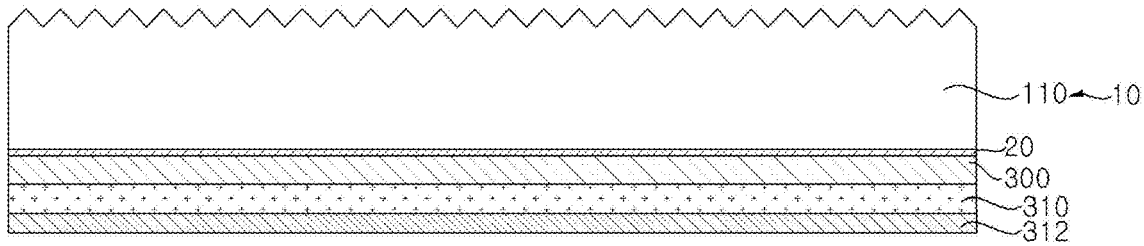
Figure 4E:
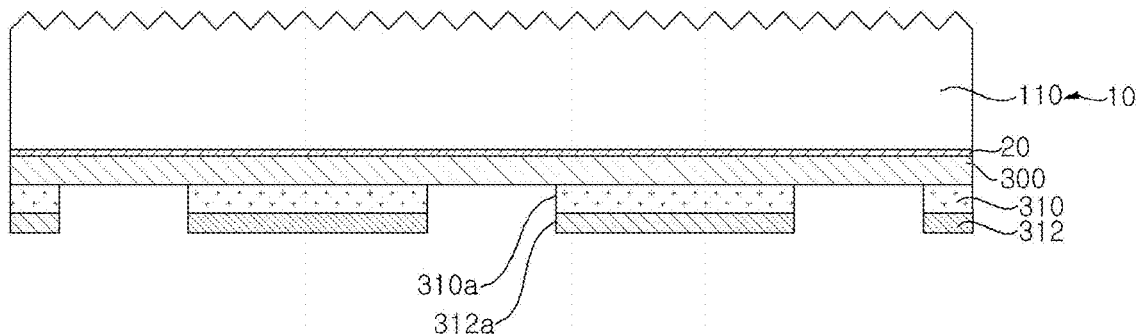

Subsequently, as illustrated in FIGS. 4D and 4E, a first doping layer 310, which includes a first conductive dopant and has a first opening 310a, is formed over the semiconductor layer 300. At this time, an undoped layer 312 may further be disposed on the first doping layer 310. The undoped layer 312 has the same pattern as that of the first doping layer 310, and thus has a first opening 312a.

For example, as illustrated in FIG. 4D, first, the first doping layer 310 is formed over the entire semiconductor layer 300. Then, the undoped layer 312 may be formed over the entire first doping layer 310.

Figure 4F:
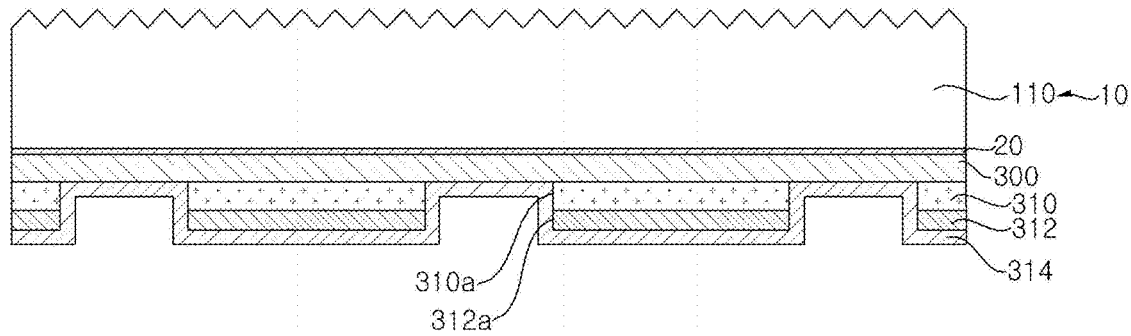
Figure 4G:
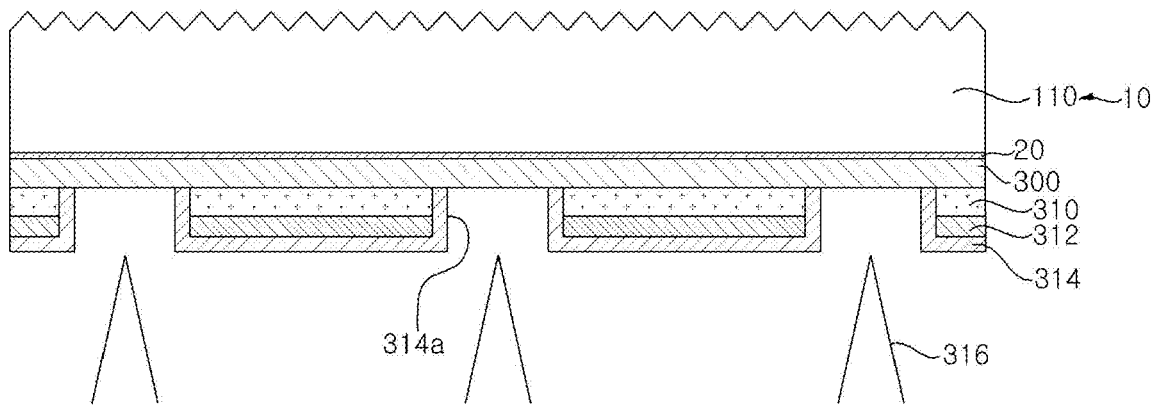
Figure 4H:
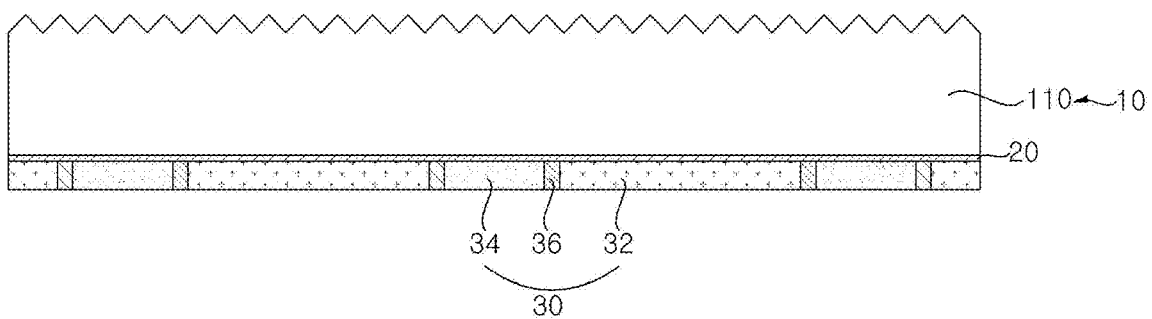

The first doping layer 310 includes the first conductive dopant, and serves to provide the semiconductor layer 300 with the first conductive dopant via diffusion in a doping process (see FIG. 4H). In the doping process, the undoped layer 312 serves to prevent the first conductive dopant included in the first doping layer 310 from being diffused outward and to prevent unnecessary external substances from being introduced into the semiconductor layer 300.

The first doping layer 310 may be formed of any of various materials, which includes the first conductive dopant. In addition, the undoped layer 312 may be formed of any of various materials, which does not include any one of the first dopant and the second dopant. In one example, the first doping layer 310 may include boron silicate glass (BSG), and the undoped layer 312 may include undoped silicate glass (USG). However, the embodiment of the present invention is not limited thereto, and the first doping layer 310 and the undoped layer 312 may include various other materials excluding the aforementioned materials. In one example, when the first doping layer 310 is of an n-type, the first doping layer 310 may include phosphorous silicate glass (PSG).

Subsequently, as illustrated in FIG. 4E, the first doping layer 310 and the undoped layer 312 are patterned to form the first openings 310a and 312a in the portion at which at least the second conductive area 34 will be formed. The patterning of the first doping layer 310 and the undoped layer 312 may be performed using various methods, which may remove portions of the first doping layer 310 and the undoped layer 312. In one example, the specific portions of the first doping layer 310 and the undoped layer 312 may be removed via etching using a mask or etching paste.

FIGS. 4D and 4E and the above description illustrate that the first doping layer 310 and the undoped layer 312 are wholly formed, and thereafter are patterned so as to have the first openings 310a and 312a therein. However, the embodiment of the present invention is not limited thereto. Thus, during the formation of the first doping layer 310 and the undoped layer 312, some portions thereof corresponding to the first openings 310a and 312a may not be formed so that the first doping layer 310 and the undoped layer 312 having the first openings 310a and 312a therein may be directly formed. Various other alterations or alternatives are possible.

In the present embodiment, the first openings 310a and 312a may be formed in the portion at which the second conductive area 34 will be formed and the portion at which the barrier area 36 will be formed.

Subsequently, as illustrated in FIGS. 4F and 4G, a mask layer 314, which has a second opening 314a therein, is formed so as to expose at least a portion of the first openings 310a and 312a while covering the first doping layer 310 and the undoped layer 312.

As illustrated in FIG. 4F, the mask layer 314 is formed over the entire back surface of the substrate 10. The mask layer 314 serves to prevent the second conductive dopant from being diffused to the portion, at which the mask layer 314 is formed, in the doping process. The mask layer 314 may be formed of any of various materials, which is an undoped material having no second conductive dopant and is capable of preventing the diffusion of the second conductive dopant. In one example, the mask layer 314 may be a single layer including a silicon oxide, a silicon nitride, intrinsic amorphous silicon, or a silicon carbide (SiC). In particular, when the mask layer 314 is a single layer formed of a silicon carbide, the mask layer 314 may effectively prevent the diffusion of the dopant. In addition, the mask layer 314, which is a single layer formed of a silicon carbide, may be easily processed using a laser so as to have a desired shape, and may be easily removed using an etching solution (e.g., an acid solution, for example, diluted hydrofluoric acid (HF)) after the doping process.

In one example, the mask layer 314 may be formed via deposition. However, the embodiment of the present invention is not limited thereto, and various other methods may be applied to form the mask layer 314.

Subsequently, as illustrated in FIG. 4G, the mask layer 314 is patterned to form the second opening 314a in the portion at which the second conductive area 34 will be formed. In the present embodiment, the second opening 314a may be formed by removing a portion of the mask layer 314 via laser ablation using a laser 316. When the mask layer 314 is patterned using the laser 316, the second opening 314a, which has a small width or any of various desired patterns, may be easily formed. In addition, damage to the semiconductor layer 300 may be minimized based on, for example, the kind and wavelength of the laser 316.

The kind, wavelength, pulse width, and beam magnitude of the laser 316 may be selected to ensure easy patterning of the mask layer 314 and to prevent deterioration in the properties of the semiconductor layer 300.

In one example, upon laser etching, the laser 316 may have a wavelength of 1064 nm or less. This is because it is difficult to produce a laser 316 having a wavelength exceeding 1064 nm. That is, all of the wavelengths of infrared light, ultraviolet light, and visible light may be used as the laser 316. At this time, in one example, the laser 316 may be a laser having a wavelength within a range from 500 nm to 650 nm, that is, a green laser. In the present embodiment, the laser 316 is used to form the first openings 310a and 312a and/or the second opening 314a, which are required to form the first conductive area and/or the second conductive area 34, which have a greater area than contact portions (see references 402 and 404 in FIG. 4K). Accordingly, the laser 316 may be a green laser having a wavelength within a range from 500 nm to 650 nm, which is suitable for radiating a large area and is capable of being directed in a large quantity so as to minimize deformation in, for example, the crystalline structure and shape of the semiconductor layer 300. In this way, no inner laser marks 38b may be located inside the second conductive area 34. On the other hand, because an ultraviolet laser is mainly used when the contact portions 402 and 404 having an extremely small area are formed, major deformation occurs in, for example, the crystalline structure and the shape of the semiconductor layer 300, thus leaving internal laser marks in most instances.

In addition, the laser 316 may have a pulse width ranging from femtoseconds (fs) to nanoseconds (ns), thus facilitating etching. In addition, the laser beam mode of the laser 316 may be a single shot or a burst shot. The burst shot is a single laser beam divided and emitted as a plurality of shots. The use of the burst shot may minimize damage to the semiconductor layer 300. In addition, the magnitude of the laser beam of the laser 316 may be within a range from 10 μm to 2 mm. When the magnitude of the laser beam (more particularly, the length of the beam) of the laser 316 is smaller than the second conductive area 34, as illustrated in FIG. 5, etching may be performed by overlapping laser beams with each other in the longitudinal direction. An outer laser mark (see reference numeral 38a in FIG. 2) may be formed by the outer edge of the laser beam, which is the boundary between the portion at which the laser beam is located and the portion at which no laser beam is located, and an inner laser mark (see reference numeral 38b in FIG. 2) may be formed along the portion at which the laser beams overlap each other. The shape of the laser beam may have any of various shapes, such as a rectangular shape, a circular shape, an oval shape, or a shape having opposite rounded ends, as illustrated in (a) to (d) of FIG. 5. In addition, the laser beam may have, for example, a square or octagonal shape. For example, when the laser beam has a rectangular shape, as illustrated in (a) of FIG. 5, the inner laser mark 38b may take the form of a line crossing the outer laser mark 38a. However, the embodiment of the present invention is not limited thereto, and various laser shapes may be used.

The second opening 314a formed in the mask layer 314 is a doping opening for the doping of the second conductive area 34, and the shape of the second opening 314a may correspond to or coincide with the shape of the second conductive area 34. In the present embodiment, by forming the second opening 314a, which is a doping opening, using the laser 316 in a simplified process, it is possible to minimize damage to the semiconductor layer 300 during the formation of the second opening 314a.

On the other hand, for example, wet etching has conventionally been used in order to form the doping opening. The wet etching may cause etching of a semiconductor layer (more particularly, an undoped intrinsic semiconductor layer) after the doping opening is formed, thus causing damage to the semiconductor layer or deterioration in the properties of the semiconductor layer. In addition, the wet etching causes, for example, an undercutting phenomenon, thus making it difficult to precisely form the doping opening into a desired shape. In addition, the process of patterning a mask layer by applying paste for the wet etching and then removing the paste must be performed, which may complicate the manufacturing process due to the complicated patterning. In the back contact configuration in which both first and second conductive areas are located on the back surface of a semiconductor substrate, for the doping of the first and second conductive areas, doping layers and/or mask layers for the respective conductive areas may be formed and patterned. In this instance, the manufacturing process may be very complicated.

In the present embodiment, the mask layer 314 may include a barrier portion, which is located near the first doping layer 310 and the undoped layer 312 and covers portions of the first openings 310a and 312a formed in the first doping layer 310 and the undoped layer 312. In one example, the barrier portion may be formed along the edge of the first doping layer 310 at the edge of the first opening 310a formed in the first doping layer 310. As such, the area of the second opening 314a formed in the mask layer 314 may be smaller than the area of the first openings 310a and 312a formed in the first doping layer 310 and the undoped layer 312. The barrier portion serves to form a barrier area (see reference numeral 36 in FIG. 4G). This will be described later in more detail.

However, the embodiment of the present invention is not limited thereto. Accordingly, the second opening 314a may have the same area as that of the first openings 310a and 312a so as to expose the entire first openings 310a and 312a without the formation of the barrier portion.

Subsequently, as illustrated in FIG. 4H, the first conductive area 32 and the second conductive area 34 are formed via thermal treatment in a doping process. For example, in the doping process, the thermal treatment may be performed in a gas atmosphere containing a second conductive dopant. The gas atmosphere may be created using various gases containing the second conductive dopant. In one example, when the second conductive dopant is phosphorus (P), the gas atmosphere may include phosphoryl chloride ($POCl_3$).

Thereby, the first conductive dopant contained in the first doping layer 310 is diffused to the semiconductor layer (see reference numeral 300 in FIG. 4G), thereby forming the first conductive area 32. Then, the second conductive dopant is thermally diffused from the back surface of the semiconductor substrate 10 to the semiconductor layer 300 through the second opening 314a, thereby forming the second conductive area 34.

At this time, the front surface of the semiconductor substrate 10 may be doped with the second conductive dopant during the doping process of forming the conductive areas 32 and 34. Thereby, the front surface field area 130 may also be formed during the doping process. However, the embodiment of the present invention is not limited thereto. Thus, in the doping process, an anti-diffusion film may be separately formed over the front surface of the semiconductor substrate 10 so that no front surface field area 130 is formed in the doping process. In this instance, the front surface field area 130 may be formed in a separate process selected from among various processes including, for example, ion implantation, thermal diffusion, and laser doping.

As described above, in the present embodiment, the first conductive area 32 is formed using the first conductive dopant included in the first doping layer 310, and the second conductive area 34 is formed via the thermal diffusion of the second conductive dopant using the gas containing the second conductive dopant. In this way, the first and second conductive areas 32 and 34 may be formed via a simplified process.

In addition, because the first conductive dopant and the second conductive dopant are not diffused to the portion of the semiconductor layer 300, which corresponds to the barrier portion, the barrier area 36, which is formed of intrinsic polycrystalline semiconductors, is provided at the portion of the semiconductor layer 300. In this way, the semiconductor layer 30 including the barrier area 36 may be formed via a simplified process.

Although the present embodiment illustrates that the second conductive area 34 is formed via the thermal diffusion of the second conductive dopant, the embodiment of the present invention is not limited thereto.

Figure 6:
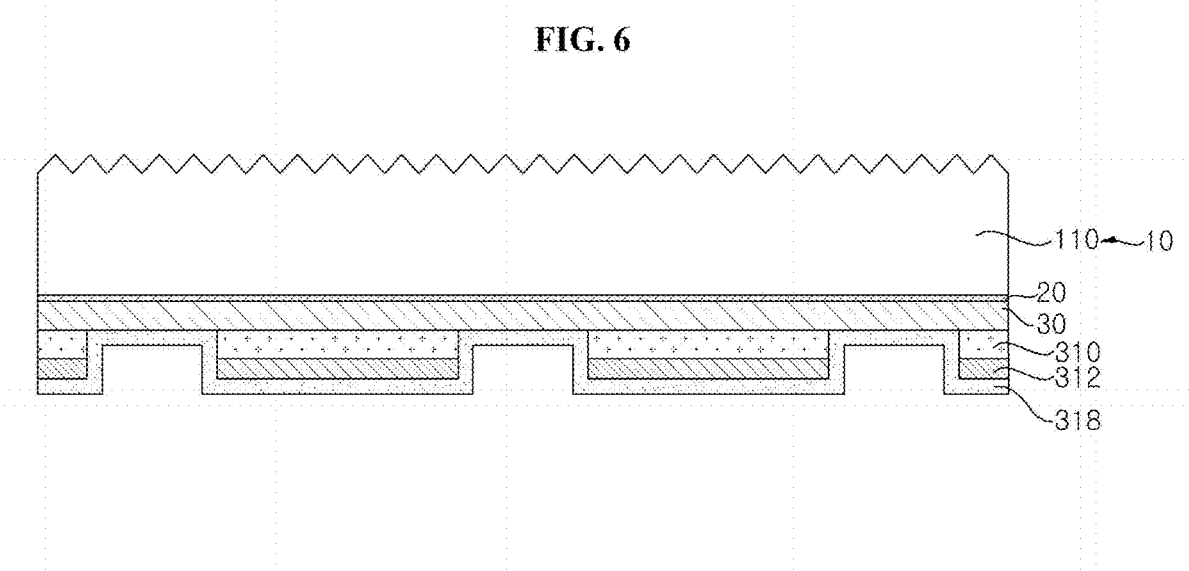
FIG. 6 is a sectional view illustrating another example of one process in the method of manufacturing the solar cell in accordance with the embodiment of the present invention.

In another example, as illustrated in FIG. 6, between the process of forming the mask layer 314 and the doping process, a second doping layer 318, which includes a second conductive dopant, may be formed so as to fill at least the second opening 314a formed in the mask layer 314. In one example, the second doping layer 318 may be formed over the entire mask layer 314 so as to fill the second opening 314a. In addition, the second doping layer 318 may be formed of phosphorous silicate glass. Although FIG. 6 illustrates the cross section of the second doping layer 318 formed on the back surface of the semiconductor substrate 10, the embodiment of the present invention is not limited thereto. Accordingly, the second doping layer 318 may be formed on the front surface of the semiconductor substrate 10 via, for example, double-sided deposition, and various other alterations or alternatives are possible. In this instance, the second conductive dopant, contained in the second doping layer 318, is diffused to the semiconductor layer 300 via a thermal treatment in the doping process, thereby forming the second conductive area 34. Accordingly, the gas containing the second conductive dopant may not be used in the doping process.

In addition, various other known methods may be used to form the conductive areas 32 and 34 and the barrier area 36. In addition, various alterations or alternatives, such as an alteration or alternatives in which the barrier area 36 is not formed, are possible.

Figure 4I:
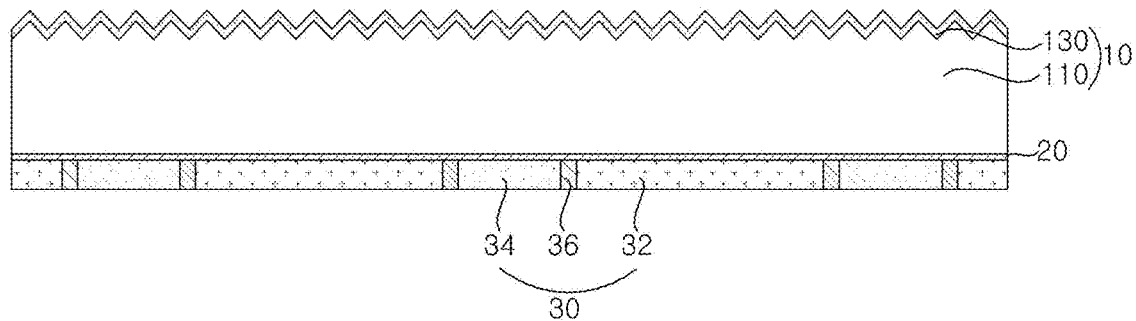

Subsequently, as illustrated in FIG. 4I, the first doping layer 310, the undoped layer 312, and the mask layer 314 are removed. Various known methods may be used to remove the first doping layer 310, the undoped layer 312, and the mask layer 314. In one example, an etching solution, such as, for example, diluted hydrofluoric acid (HF) or buffered oxide etching (BOE) solution may be used. Through the use of the etching solution described above, the first doping layer 310, the undoped layer 312, and the mask layer 314, which are formed of, for example, boron or phosphorus doped silicate glass, undoped silicate glass, or silicon carbide, may be easily removed. At this time, because the semiconductor layer 30 is doped, the semiconductor layer 30 is not greatly damaged even if wet etching is performed. However, the embodiment of the present invention is not limited thereto, and the mask layer 314 may be removed using various other methods.

Figure 4J:
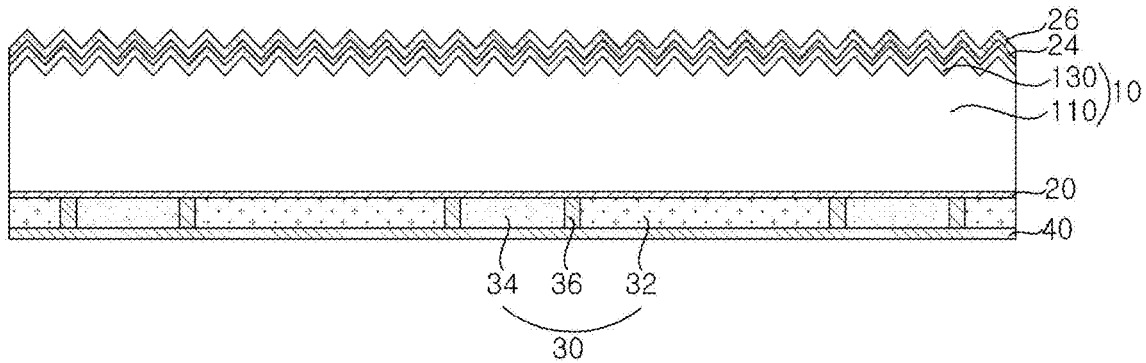

Subsequently, as illustrated in FIG. 4J, insulation films are formed on the front surface and the back surface of the semiconductor substrate 10. That is, a front surface passivation film 24 and an anti-reflection film 26 are formed on the front surface of the semiconductor substrate 10, and a back surface passivation film 40 is formed on the back surface of the semiconductor substrate 10.

For example, the front surface passivation film 24 and the anti-reflection film 26 are formed over the entire front surface of the semiconductor substrate 10, and the back surface passivation film 40 is formed over the entire back surface of the semiconductor substrate 10. The front surface passivation film 24, the anti-reflection film 26, or the back surface passivation film 40 may be formed via various methods such as, for example, vacuum deposition, chemical vapor deposition, spin coating, screen printing, or spray coating. The sequence of forming the front passivation film 24, the anti-reflection film 26, and the back surface passivation film 40 is not defined.

Figure 4K:
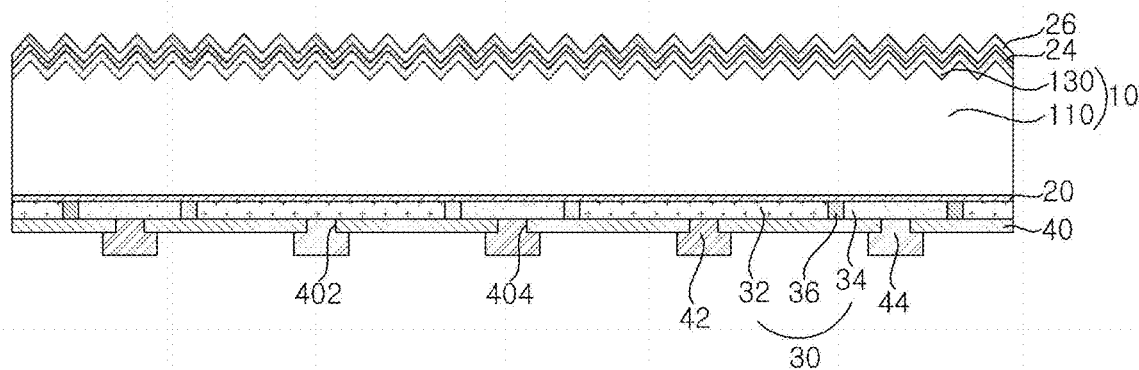

Subsequently, as illustrated in FIG. 4K, first and second electrodes 42 and 44, which are respectively connected to the first and second conductive areas 32 and 34, are formed.

In one example, first and second contact portions 402 and 404 are formed in the back surface passivation film 40 via patterning, and thereafter the first and second contact portions 402 and 404 are filled with the first and second electrodes 42 and 44. At this time, the first and second contact portions 402 and 404 may be formed via various methods such as laser ablation using a laser, or etching using an etching solution or etching paste. In addition, the first and second electrodes 42 and 44 may be formed via various other methods, such as, for example, plating or deposition.

In another example, the first and second electrodes 42 and 44 having the above-described shape may be formed by applying paste, for the formation of the first and second electrodes 42 and 44, to the back surface passivation film 40 via, for example, screen printing, and thereafter performing, for example, fire-through or laser firing contact. In this instance, because the first and second contact portions 402 and 404 are formed when the first and second electrode 42 and 44 are formed, a separate process of forming the first and second contact portions 402 and 404 is unnecessary.

At this time, in the present embodiment, the laser marks 38, formed in at least one of the first and second conductive areas 32 and 34, may be used as alignment marks when the first and second contact portions 402 and 404 are formed or when the first and second electrodes 42 and 44 are formed or patterned. This is because the laser marks 38 are formed so as to correspond to at least one of the first and second conductive areas 32 and 34. In particular, because the outer laser marks 38a are formed along the edge of at least one of the first and second conductive areas 32 and 34, the outer laser marks 38a may effectively serve as the alignment marks described above. When the laser marks 38 are used as the alignment marks, improved alignment may be accomplished without a separate process.

According to the present embodiment, the semiconductor layer 30 including the first and second conductive areas 32 and 34 may have excellent properties, whereby the solar cell 100 having excellent efficiency may be manufactured via a simplified process. In this way, the efficiency and productivity of the solar cell 100 may be improved.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A method of manufacturing a solar cell, the method comprising:
    forming a tunneling layer over one surface of a semiconductor substrate;
    forming a semiconductor layer over the tunneling layer;
    forming a conductive area including a first conductive area of a first conductive type and a second conductive area of a second conductive type in the semiconductor layer; and forming an electrode including a first electrode connected to the first conductive area and a second electrode connected to the second conductive area, wherein the forming of the conductive area includes:

forming a mask layer over the semiconductor layer;

forming a doping opening corresponding to at least one of the first conductive area and the second conductive area in the mask layer using a laser; and performing doping using the doping opening, wherein a mark is made in the semiconductor layer in the forming of the doping opening.

2. The method according to claim 1, wherein the mark includes an outer mark formed along a longitudinally extending edge of at least one of the first conductive area and the second conductive area.

3. The method according to claim 2, wherein the outer mark takes a form of a line formed along each of opposite longitudinally extending edges of at least one of the first conductive area and the second conductive area.

4. The method according to claim 2, wherein the mark is not formed inside at least one of the first conductive area and the second conductive area.

5. The method according to claim 2, wherein the mark further includes an inner mark formed inside at least one of the first conductive area and the second conductive area.

6. The method according to claim 5, wherein the outer mark is denser than the inner mark in at least one of the first conductive area and the second conductive area.

7. The method according to claim 5, wherein the inner mark has a line shape, a closed curve shape, or a polygonal shape, which crosses the outer mark.

8. The method according to claim 1, wherein the first conductive area is of a different conductive type from that of a base area of the semiconductor substrate, wherein the second conductive area is of the same conductive type as that of the base area of the semiconductor substrate, and wherein the mark is formed at an edge of the second conductive area and is not formed in the first conductive area.

9. The method according to claim 1, wherein each of the first conductive area and the second conductive area has a stripe arrangement, and wherein, in the forming of the doping opening, laser beams of the laser are emitted so as to overlap each other in a longitudinal direction of at least one of the first conductive area and the second conductive area, thereby forming the doping opening.

10. The method according to claim 1, wherein the forming of the conductive area further includes forming a first doping layer, which includes an opening and corresponds to an area on which the first conductive area is to be formed, between the forming of the semiconductor layer and the forming of the mask layer, wherein, in the forming of the mask layer, the mask layer is formed over the entire semiconductor layer and the entire first doping layer, wherein, in the forming of the doping opening, the doping opening is formed so as to correspond to the second conductive area, and wherein, in the performing of the doping, a first conductive dopant, included in the first doping layer, is diffused to the semiconductor layer via thermal treatment in a gas atmosphere, which includes a second conductive dopant, so as to form the first conductive area, and the second conductive dopant is diffused to the semiconductor layer so as to form the second conductive area.

11. The method according to claim 10, wherein, in the forming of the doping opening, the doping opening is formed to have a smaller area than that of the opening of the first doping layer, so that an undoped barrier area is located between the first conductive area and the second conductive area after the performing of the doping, and wherein, in the performing of the doping, an opposite surface of the semiconductor substrate is doped with the second conductive dopant so that a front surface field area is formed on the opposite surface of the semiconductor substrate.

* * * * *